US012671013B2

(12) United States Patent
Petrykin et al.

(10) Patent No.: US 12,671,013 B2
(45) Date of Patent: Jun. 30, 2026

(54) METHOD OF FABRICATING SUPERCONDUCTING WIRE

(71) Applicant: SuperOx Japan LLC, Tokyo (JP)

(72) Inventors: Valery Petrykin, Tokyo (JP); Sergey Li, Tokyo (JP)

(73) Assignee: FARADAY FACTORY JAPAN LLC, Tokyo (JP)

( * ) Notice: Subject to any disclaimer, the term of this patent is extended or adjusted under 35 U.S.C. 154(b) by 1098 days.

(21) Appl. No.: 17/609,362

(22) PCT Filed: May 21, 2019

(86) PCT No.: PCT/JP2019/020130
§ 371 (c)(1),
(2) Date: Nov. 5, 2021

(87) PCT Pub. No.: WO2020/235005
PCT Pub. Date: Nov. 26, 2020

(65) Prior Publication Data
US 2022/0319740 A1    Oct. 6, 2022

(51) Int. Cl.
*H01B 12/06*      (2006.01)
*C23C 14/08*      (2006.01)
*C23C 14/35*      (2006.01)

(52) U.S. Cl.
CPC ........... *H01B 12/06* (2013.01); *C23C 14/081* (2013.01); *C23C 14/351* (2013.01)

(58) Field of Classification Search
CPC ..... H01B 12/06; C23C 14/081; C23C 14/351; C23C 14/0042; C23C 14/083;
(Continued)

(56) References Cited

U.S. PATENT DOCUMENTS

2005/0007227 A1    1/2005    Lee et al.
2007/0179063 A1    8/2007    Malozemoff et al.
(Continued)

FOREIGN PATENT DOCUMENTS

JP              5830238 B2      12/2015
JP              2016-143516 A    8/2016
WO      WO 2015/033380 A1    3/2015

OTHER PUBLICATIONS

International Search Report (ISR) (PCT Form PCT/ISA/210), in PCT/JP2019/020130, dated Aug. 6, 2019.
(Continued)

*Primary Examiner* — Patrick S Ott
(74) *Attorney, Agent, or Firm* — McGinn IP Law Group, PLLC

(57)               ABSTRACT

A method of fabricating a superconducting wire includes forming a buffer layer on the substrate, the buffer layer including an $Al_2O_3$ layer, the $Al_2O_3$ layer being formed by reactive magnetron sputtering in which first oxygen gas as reactant gas and a sputtering target made of aluminium metal are used, the $Al_2O_3$ layer being formed while being supplied the first oxygen gas at a first concentration, the first concentration being a concentration of the first oxygen gas at which an emission intensity of Al in plasma near a surface of the sputtering target is not less than 25% and not more than 80% of a first reference value, the first reference value being the emission intensity of Al at which the concentration of the first oxygen gas is zero; and forming a superconducting layer above the buffer layer.

20 Claims, 14 Drawing Sheets

(58) Field of Classification Search
CPC ... C23C 14/221; C23C 14/544; C23C 14/562;
Y02E 40/60; H10N 60/0632
See application file for complete search history.

(56) References Cited

U.S. PATENT DOCUMENTS

| | | | |
|---|---|---|---|
| 2008/0230779 A1 | 9/2008 | Goyal | |
| 2011/0160066 A1* | 6/2011 | Aytug | C23C 14/024 |
| | | | 204/192.15 |
| 2012/0196752 A1* | 8/2012 | Hanyu | C23C 14/3464 |
| | | | 505/150 |
| 2015/0354052 A1* | 12/2015 | Bugyi | C23C 14/548 |
| | | | 204/192.15 |
| 2016/0247608 A1* | 8/2016 | Choi | C23C 2/08 |
| 2019/0245090 A1* | 8/2019 | Kusayanagi | H01L 29/7869 |

OTHER PUBLICATIONS

Extended European Search Report, dated Apr. 3, 2023.in European
Application No. 19929383.8-1212.
Notification Concerning Transmittal of International Preliminary
Report on Patentability (PCT/IB/326) May 21, 2019.

* cited by examiner

METHOD OF FABRICATING SUPERCONDUCTING WIRE

TECHNICAL FIELD

This invention relates to a method of fabricating a superconducting wire.

BACKGROUND ART

The superconducting wire of the second generation (coated conductor) has multilayer structure. The typical architecture is presented in FIG. 1, although each wire manufacturer implements some original changes in the combination of buffer layers and their chemical composition. A superconducting wire that contains an $Al_xO$ layer formed by reactive magnetron sputtering in the oxygen deficient atmosphere has been known (See e.g. Patent Literature 1). Here, AlxO is aluminum rich alumina.

Additionally, a superconducting wire that contains an MgO film formed by reactive magnetron sputtering to which ion beam assisted deposition (IBAD) is applied has been known (See e.g. Patent Literature 2).

A sputtering target used in usual magnetron sputtering is made of the same material as a film to be formed. Consequently, a sputtering target made of metal oxide is used in order to form a metal-oxide film by usual magnetron sputtering.

On the other hand, when a metal-oxide film is formed by reactive magnetron sputtering, a sputtering target made of metal contained in an objective metal-oxide film can be used with addition of oxygen gas as reactive gas for in situ oxidation of metal atoms in the magnetron plasma during deposition process.

Reactive magnetron sputtering using a metal sputtering target has higher deposition rate than usual magnetron sputtering using a metal-oxide sputtering target even if the magnetron powers of both are equal because metal has lower crystal lattice energy than metal oxide containing the metal.

Moreover, metal-oxide sputtering targets are usually more expensive than metal sputtering targets. Consequently, the use of reactive magnetron sputtering can reduce the production cost of a metal-oxide film.

For these reasons, the use of reactive magnetron sputtering to produce buffer layer containing a sequence of metal-oxide films for superconducting wires manufacturing can achieve improvement of the production rate and reduction of the production cost of the final product.

CITATION LIST

Patent Literature

[PTL 1]
WO 2015/033380 A1
[PTL 2]
Japanese Patent No. 5830238

SUMMARY OF INVENTION

Technical Problem

It is known that, in reactive magnetron sputtering, deposition rate and composition of thin films significantly change according to flow rate of introduced reactant gas. When flow rate of oxygen gas as reactant gas is small, metal atoms sputtered from a metal sputtering target are deposited without reacting with the oxygen gas, which forms a metal film (metal mode). Consequently, pure metal-oxide films can't be obtained in a metal mode.

On the other hand, when flow rate of oxygen gas as reactant gas is large, a surface of a metal sputtering target is oxidized. Consequently, metal oxides are sputtered from the surface and deposited, which forms a metal-oxide film (oxide mode). However, a deposition rate in an oxide mode is low and is not very different from a deposition rate in usual magnetron sputtering using a metal-oxide sputtering target.

Additionally, a transition area exhibiting hysteresis phenomenon exists between the metal mode and the oxide mode. An oxidation degree on a surface of a metal sputtering target in the transition area is less than that in the oxide mode, and thus both of metal oxides and metal atoms are sputtered from a metal sputtering target. In ideal case, the oxidation of metal atoms should take place in the magnetron plasma, while target surface should be composed of pure metal. Consequently, sputtering rate in the transition area is higher than that in the oxide mode. Additionally, metal atoms are oxidized in plasma and solid material is deposited in the form of metal oxides, and thus an objective metal-oxide film is obtained.

However, since reaction between metal atoms and oxygen gas is a steady state process and it represents a dynamical equilibrium between metal, oxygen and metal oxide, it is unstable in the transition area, and formation of metal-oxide films by using the transition area has not been carried out in conventional techniques of buffer fabrication for coated conductors.

An objective of the present invention is to improve a fabricating speed of buffer layers of a superconducting wire. For this object, metal-oxide films of the superconducting wire are stably formed at a high rate by controlling reactions in a transition area of reactive magnetron sputtering.

Solution to Problem

[1] For achieving the above objective, the present invention provides a method of fabricating a superconducting wire, including:

forming a buffer layer on the substrate, the buffer layer including an $Al_2O_3$ layer, the $Al_2O_3$ layer being formed by reactive magnetron sputtering in which first oxygen gas as reactant gas and a sputtering target made of aluminum metal are used, the $Al_2O_3$ layer being formed while being supplied the first oxygen gas at a first concentration, the first concentration being a concentration of the first oxygen gas at which an emission intensity of Al in plasma near a surface of the sputtering target is not less than 25% and not more than 80% of a first reference value, the first reference value being the emission intensity of Al at which the concentration of the first oxygen gas is zero; and forming a superconducting layer above the buffer layer.

[2] In the method of fabricating a superconducting wire, according to [1], the first concentration is the concentration of the first oxygen gas at which the emission intensity of Al is not less than 30% and not more than 80% of the first reference value.

[3] In the method of fabricating a superconducting wire, according to [1] or [2], the buffer layer includes an $Y_2O_3$ layer on the $Al_2O_3$ layer, the $Y_2O_3$ layer being formed by reactive magnetron sputtering in which second oxygen gas as reactant gas and a sputtering target made of yttrium metal are used, the $Y_2O_3$ layer being formed while being supplied the second oxygen gas at a second concentration, the second concentration being a concentration of the second oxygen gas at which an emission intensity of Y in plasma near a surface of the sputtering target is not less than 15% and not more than 90% of a second reference value, the second reference value being the emission intensity of Y at which the concentration of the second oxygen gas is zero.

[4] In the method of fabricating a superconducting wire, according to [3], the second concentration is the concentration of the second oxygen gas at which the emission intensity of Y is not less than 30% and not more than 80% of the second reference value.

[5] In the method of fabricating a superconducting wire, according to [3] or [4], the buffer layer includes an MgO layer having a biaxially textured structure on the $Y_2O_3$ layer, the MgO layer being formed by reactive magnetron sputtering in which third oxygen gas as reactant gas and a sputtering target made of magnesium metal are used and assisting Ar ion beam is applied, the MgO layer being formed while being supplied the third oxygen gas at a third concentration, the third concentration being a concentration of the third oxygen gas at which an emission intensity of Mg in plasma near a surface of the sputtering target is less than 50% of a third reference value, the third reference value being the emission intensity of Mg at which the concentration of the third oxygen gas is zero.

[6] In the method of fabricating a superconducting wire, according to [3] or [4], the buffer layer includes an MgO layer having a biaxially textured structure on the $Y_2O_3$ layer, the MgO layer being formed by magnetron sputtering in which a sputtering target made of MgO is used and assisting Ar ion beam is applied.

[7] For achieving the above object, the present invention provides a method of fabricating a superconducting wire, including:

forming a buffer layer on the substrate, the buffer layer including an $Y_2O_3$ layer, the $Y_2O_3$ layer being formed by reactive magnetron sputtering in which second oxygen gas as reactant gas and a sputtering target made of yttrium metal are used, the $Y_2O_3$ layer being formed while being supplied the second oxygen gas at a second concentration, the second concentration being a concentration of the second oxygen gas at which an emission intensity of Y in plasma near a surface of the sputtering target is not less than 15% and not more than 90% of a second reference value, the second reference value being the emission intensity of Y at which the concentration of the second oxygen gas is zero; and forming a superconducting layer above the buffer layer.

[8] In the method of fabricating a superconducting wire, according to [7], the second concentration is the concentration of the second oxygen gas at which the emission intensity of Y is not less than 30% and not more than 80% of the second reference value.

[9] In the method of fabricating a superconducting wire, according to [7] or [8], the buffer layer includes an MgO layer having a biaxially textured structure on the $Y_2O_3$ layer, the MgO layer being formed by reactive magnetron sputtering in which third oxygen gas as reactant gas and a sputtering target made of magnesium metal are used and assisting Ar ion beam is applied, the MgO layer being formed while being supplied the third oxygen gas at a third concentration, the third concentration being a concentration of the third oxygen gas at which an emission intensity of Mg in plasma near a surface of the sputtering target is less than 50% of a third reference value, the third reference value being the emission intensity of Mg at which the concentration of the third oxygen gas is zero.

[10] In the method of fabricating a superconducting wire, according to [7] or [8], the buffer layer includes an MgO layer having a biaxially textured structure on the $Y_2O_3$ layer, the MgO layer being formed by magnetron sputtering in which a sputtering target made of MgO is used and assisting Ar ion beam is applied.

[11] For achieving the above object, the present invention provides a method of fabricating a superconducting wire, including:

forming a buffer layer on the substrate, the buffer layer including an MgO layer, the MgO layer being formed by reactive magnetron sputtering in which third oxygen gas as reactant gas and a sputtering target made of magnesium metal are used and to which ion beam assisted deposition is applied, the MgO layer being formed while being supplied the third oxygen gas at a third concentration, the third concentration being a concentration of the third oxygen gas at which an emission intensity of Mg in plasma near a surface of the sputtering target is less than 50% of a third reference value, the third reference value being the emission intensity of Mg at which the concentration of the third oxygen gas is zero; and forming a superconducting layer above the buffer layer.

Advantageous Effects of Invention

According to the invention, it is possible to provide a method of fabricating a superconducting wire that can fabricate a superconducting wire at a high production rate and a low cost.

DESCRIPTION OF EMBODIMENTS

Structure of a Superconducting Wire

Figure 1:
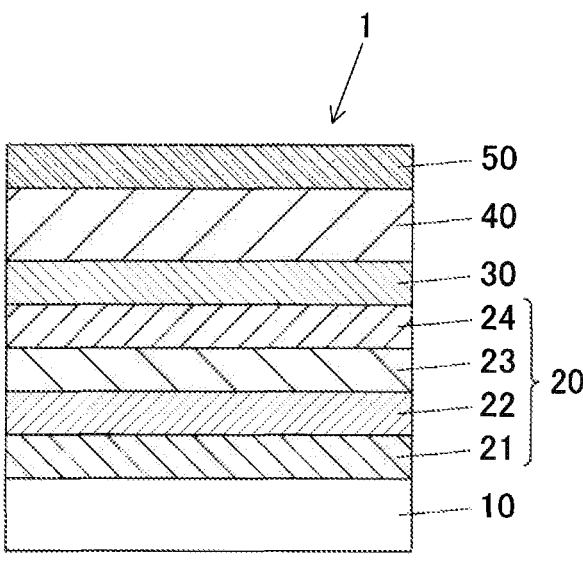
FIG. 1 is a cross sectional view of the superconducting wire according to an embodiment.

FIG. 1 is a vertical cross sectional view of the superconducting wire 1. The superconducting wire 1 contains a metal substrate 10, a buffer layer 20 formed on the substrate 10, a CeO$_2$ layer 30 formed on the buffer layer 20, a superconducting layer 40 formed on the CeO$_2$ layer 30, and a protecting layer 50 formed on the superconducting layer 40.

The buffer layer 20 contains at least one layer selected from the group consisting of an Al$_2$O$_3$ layer 21, an Y$_2$O$_3$ layer 22, and a MgO layer 23. Additionally, the buffer layer 20 preferably contains two or three layers selected from the group. The buffer layer 20 has thickness ranging, for example, from 20 to 180 nm.

When the Al$_2$O$_3$ layer 21 and the Y$_2$O$_3$ layer 22 are contained in the buffer layer 20, the Y$_2$O$_3$ layer 22 is formed on the Al$_2$O$_3$ layer 21. When the Y$_2$O$_3$ layer 22 and the MgO layer 23 are contained in the buffer layer 20, the MgO layer 23 is formed on the Y$_2$O$_3$ layer 22. When the Al$_2$O$_3$ layer 21 and the MgO layer 23 are contained in the buffer layer 20, the MgO layer 23 is formed on the upper side of the Al$_2$O$_3$ layer 21. When the Al$_2$O$_3$ layer 21, the Y$_2$O$_3$ layer 22, and the MgO layer 23 are contained in the buffer layer 20, the Y$_2$O$_3$ layer 22 is formed on the Al$_2$O$_3$ layer 21, and the MgO layer 23 is formed on the Y$_2$O$_3$ layer 22.

In the examples shown in FIG. 1, the buffer layer 20 contains the Al$_2$O$_3$ layer 21, the Y$_2$O$_3$ layer 22 formed on the Al$_2$O$_3$ layer 21, the MgO layer 23 formed on the Y$_2$O$_3$ layer 22, and a LaMnO$_3$ layer 24 formed on the MgO layer 23.

The Al$_2$O$_3$ layer 21 is formed by reactive magnetron sputtering in which oxygen gas as reactant gas and a sputtering target made of aluminium metal are used. The Y$_2$O$_3$ layer 22 is formed by reactive magnetron sputtering in which oxygen gas as reactant gas and a sputtering target made of yttrium metal are used.

The MgO layer 23 is formed by reactive magnetron sputtering in which oxygen gas as reactant gas and a sputtering target made of magnesium metal are used and assisting Ar ion beam used in ion beam assisted deposition (IBAD) method is applied. Alternatively, another MgO layer formed by magnetron sputtering in which a sputtering target made of MgO is used and assisting Ar ion beam is applied can be used instead of the MgO layer 23.

One or more layers in the buffer layer 20 other than the Al$_2$O$_3$ layer 21, the Y$_2$O$_3$ layer 22, and the MgO layer 23 are formed, for example, by physical vapor deposition or solution deposition methods.

The Al$_2$O$_3$ layer 21 has thickness ranging, for example, from 20 to 80 nm. The Y$_2$O$_3$ layer 22 has thickness ranging, for example, from 7 to 35 nm.

The MgO layer 23 has a biaxially textured structure. The MgO layer 23 may contain dopant, such as Ca, Sr or Cu. The MgO layer 23 has thickness ranging, for example, from 5 to 20 nm. Additionally, other layer that have the biaxially textured structure made of materials with rock salt structure other than MgO may be used instead of the MgO layer 23.

In case that the layer directly formed on the MgO layer 23, such as the LaMnO$_3$ layer 24, has a perovskite structure, the layer lattice-matches with the MgO layer 23.

The substrate 10 is a tape-like substrate and mainly contains metal or metal alloys, such as Hastelloy (Trademark). Additionally, a stainless steel tape or the tape with Y$_2$O$_3$ layer prepared by solution-deposition-planarization process may be used as the substrate 10. The substrate 10 has thickness ranging, for example, from 20 to 100 micrometers.

The LaMnO$_3$ layer 24 can function as a cap layer which suppresses chemical reaction between the MgO layer 23 and the superconducting layer 40. In addition, the LaMnO$_3$ layer 24 improves lattice matching for the epitaxial growth of the superconducting layer 40. The LaMnO$_3$ layer 24 has thickness ranging, for example, from 20 to 50 nm.

The CeO$_2$ layer 30 is a buffer layer between the LaMnO$_3$ layer 24 and the superconducting layer 40. The CeO$_2$ layer 30 may be doped with rare-earth element, such as Gd, to improve texture of the CeO$_2$ layer 30 and to enhance oxygen diffusion during oxygen annealing process. When oxygen ions in the CeO$_2$ layer 30 diffuse to the superconducting layer 40, uniform distribution of oxygen ions in the superconducting layer 40 can be achieved during shorter time.

The CeO$_2$ layer 30 is formed with lattice matching on the LaMnO$_3$ layer 24 having a perovskite structure. The CeO$_2$ layer 30 has thickness ranging, for example, from 100 to 500 nm.

Note that, the CeO$_2$ layer 30 may be not contained in the superconducting wire 1. That is to say, the superconducting layer 40 is formed directly or indirectly on the buffer layer 20. In other words, the superconducting layer 40 is formed above the buffer layer 20.

The superconducting layer 40 preferably mainly contains high-Tc superconductor, such as REBa$_2$Cu$_3$O$_{6+x}$, wherein RE is rare earth element, such as Y, Nd, Eu, or Gd. Additionally, the superconducting layer 40 more preferably mainly contains YBa$_2$Cu$_3$O$_{6+x}$ or GdBa$_2$Cu$_3$O$_{6+x}$ or combination thereof. The superconducting layer 40 may contain nonconducting nanoparticles for improving superconducting properties in the magnetic field. The superconducting layer 40 has thickness ranging, for example, from 1 to 6 micrometers.

The protecting layer 50 protects the superconducting layer 40 from ambient atmosphere and mechanical damage, and provides good electrical contact. The protecting layer 50 contains Ag or the like. The protecting layer 50 has thickness ranging, for example, from 0.5 to 10.0 micrometers.

Fabrication of the Superconducting Wire

An example of a fabrication process of the superconducting wire 1 is described below.

Figure 2:
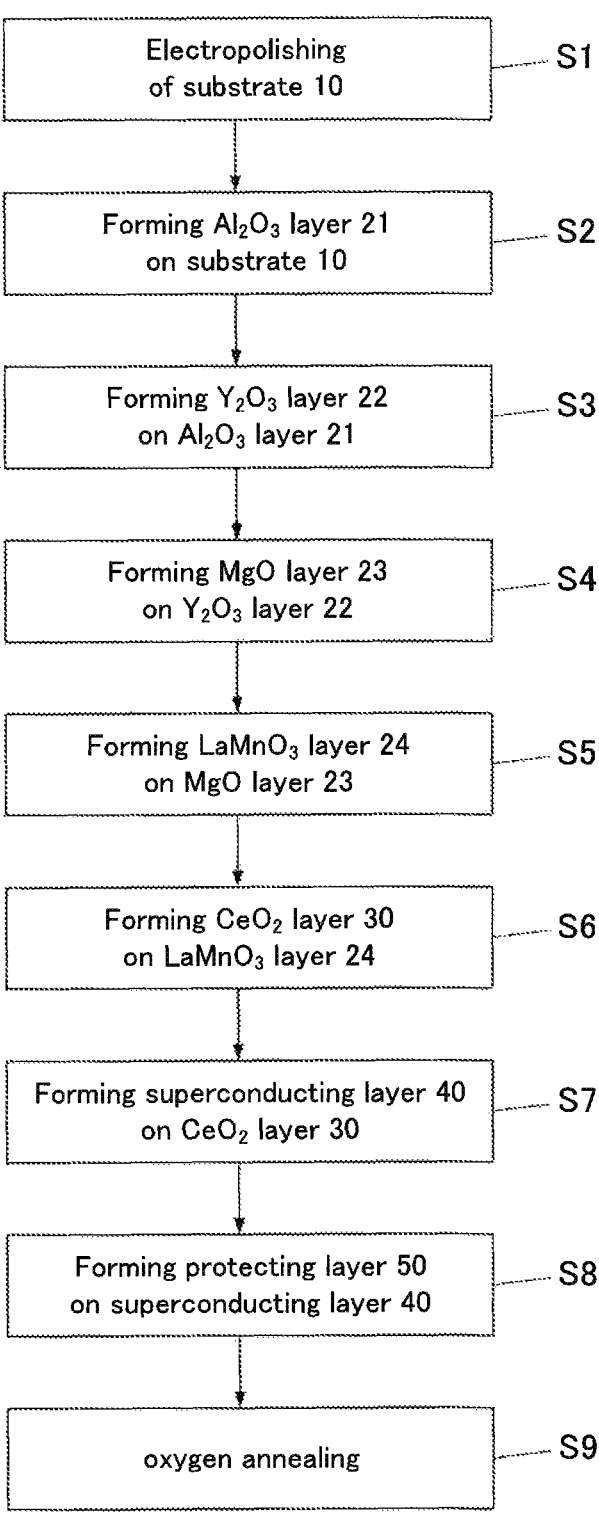
FIG. 2 is a flow chart showing a fabrication process of the superconducting wire according to the embodiment.

FIG. 2 is a flow chart showing a fabrication process of the superconducting wire 1. Firstly, electro-polishing is performed to a surface of the substrate 10 (step S1).

Next, the $Al_2O_3$ layer 21 is formed on the substrate 10. (step S2). The $Al_2O_3$ layer 21 is formed by reactive magnetron sputtering in which oxygen gas as reactant gas and a sputtering target made of aluminium metal are used. The $Al_2O_3$ layer 21 is formed while being supplied the oxygen gas at a first concentration. The first concentration is set to an oxygen gas concentration at which an emission intensity of Al in plasma near a surface of the sputtering target is not less than 25% and not more than 80% of a first reference value in order to provide a sufficiently higher deposition rate than that of usual magnetron sputtering using a metal-oxide sputtering target. Here, "near a surface of the sputtering target" denotes, e.g. "in the range of 0-3 cm above the surface of the sputtering target". The first reference value is the emission intensity of Al at which oxygen the gas concentration is zero. The reactive magnetron sputtering is achieved mainly in the transition area, and may be achieved only in the transition area.

Next, the $Y_2O_3$ layer 22 is formed on the $Al_2O_3$ layer 21. (step S3). The $Y_2O_3$ layer 22 is formed by reactive magnetron sputtering in which oxygen gas as reactant gas and a sputtering target made of yttrium metal are used. The $Y_2O_3$ layer 22 is formed while being supplied the oxygen gas at a second concentration. The second concentration is set to an oxygen concentration at which an emission intensity of Y in plasma near a surface of the sputtering target is not less than 15% and not more than 90% of a second reference value in order to provide a sufficiently higher deposition rate than that of usual magnetron sputtering using a metal-oxide sputtering target. Here, "near a surface of the sputtering target" denotes, e.g. "in the range of 0-3 cm above the surface of the sputtering target". The second reference value is the emission intensity of Y at which the oxygen gas concentration is zero. The reactive magnetron sputtering is achieved mainly in the transition area, and may be achieved only in the transition area.

The first concentration may be the oxygen gas concentration at which the emission intensity of Al is not less than 30% and not more than 65% of the first reference value. The second concentration may be an oxygen gas concentration at which the emission intensity of Y is not less than 35% and not more than 65% of the second reference value.

Next, the MgO layer 23 is formed on the $Y_2O_3$ layer 22. (step S4). The MgO layer 23 is formed by reactive magnetron sputtering in which oxygen gas as reactant gas and a sputtering target made of magnesium metal are used and assisting Ar ion beam is applied. The MgO layer 23 is formed while being supplied the oxygen gas at a third concentration. In case that a sputtering target made of magnesium metal are used, the third concentration is set to an oxygen concentration at which an emission intensity of Mg in plasma near a surface of the sputtering target is less than 50% of a third reference value in order to provide a sufficiently higher deposition rate than that of usual magnetron sputtering using a metal-oxide sputtering target. Here, "near a surface of the sputtering target" denotes, e.g. "in the range of 0-3 cm above the surface of the sputtering target". The third reference value is the emission intensity of Mg at which oxygen gas concentration is zero. The reactive magnetron sputtering is achieved mainly in the transition area, and may be achieved only in the transition area.

In the reactive magnetron sputtering in which assisting Ar ion beam is applied, MgO is deposited by reactive magnetron sputtering while being irradiated with Ar ions as assist ions, which forms the MgO layer 23.

Next, the $LaMnO_3$ layer 24 is formed on the MgO layer 23 by RF-magnetron sputtering, DC-magnetron sputtering or PLD methods (step S5).

Next, the $CeO_2$ layer 30 is formed on the $LaMnO_3$ layer 24 by PLD method or RF-magnetron sputtering (step S6).

Next, the superconducting layer 40 is formed on the $CeO_2$ layer 30 by PLD method (step S7). Additionally, oxygen should be introduced to the superconducting layer 40 by oxygen annealing. Oxygen concentration in the superconducting layer 40 is essential for its superconductive characteristics, such as critical temperature and critical current.

Next, the protecting layer 50 is formed on the superconducting layer 40 by DC magnetron sputtering method (step S8).

Next, an amount of oxygen in the superconducting layer 40 is appropriately adjusted by oxygen annealing (step S9).

Figure 3:
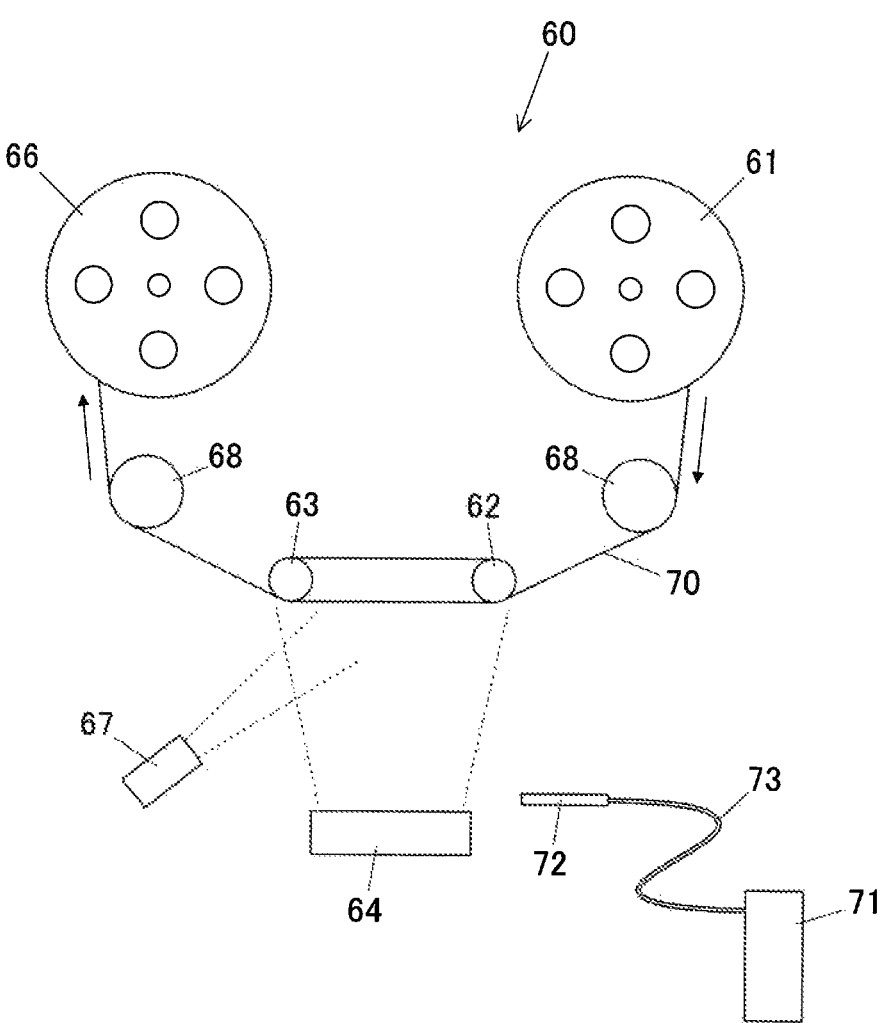
FIG. 3 is a diagrammatic illustration of a reactive magnetron sputtering device set up that is used to form the buffer layer according to the embodiment.

FIG. 3 is a diagrammatic illustration of a reactive magnetron sputtering device 60 that is used to form the buffer layer 20.

The reactive magnetron sputtering device 60 contains a feeding reel 61 to feed a tape 70, guiding reels 62 and 63 to wind the tape 70 fed by the feeding reel 61, a sputtering target 64 with the magnetron head to form a metal-oxide film, such as the $Al_2O_3$ layer 21, the $Y_2O_3$ layer 22, or the MgO layer 23, on the tape 70 wound by the guiding reels 62 and 63, and a receiving reel 66 to reel the tape 70 having the metal-oxide film. Additionally, as shown in FIG. 3, the reactive magnetron sputtering device 60 may contain guide rollers 68 between the feeding reel 61 and the guiding reel 62 and between the guiding reel 63 and the receiving reel 66.

Additionally, an assisting ion gun 67 to emit assisting Ar ion beam is used in the reactive magnetron sputtering device 60 when a textured layer, such as the MgO layer 23, is fabricated.

The tape 70 is composed of the substrate 10, or the substrate 10 and a layer already formed on the substrate 10.

An emission intensity of metal such as Al, Y, or Mg in plasma near the surface of the sputtering target 64 is measured by a plasma emission controller or the like connected to a photomultiplier tube (PMT) unit 71. Plasma light that enters a collimator 72 propagates through an optical fiber 73 and is detected by the PMT unit 71.

Here, intensities of the plasma light near wavelength of 396.5 nm, 407.5 nm, and 285.0 nm are respectively detected to measure an emission intensity of Al, Y, and Mg.

Example 1

Preferred forming conditions of the $Al_2O_3$ layer 21 by the reactive magnetron sputtering have been determined by experiments.

In an example 1, plasma emission controller RU-1000 made by HORIBA STEC, Co., Ltd. was used as a plasma emission controller. Additionally, an electropolished Hastelloy tape of 60 μm (micrometers) thickness and with surface roughness of less than 1 nm having a width of 12 mm was used as the substrate 10. Moreover, a sputtering target made of aluminium metal was used as the sputtering target 64 for forming the $Al_2O_3$ layer 21.

Figure 4:
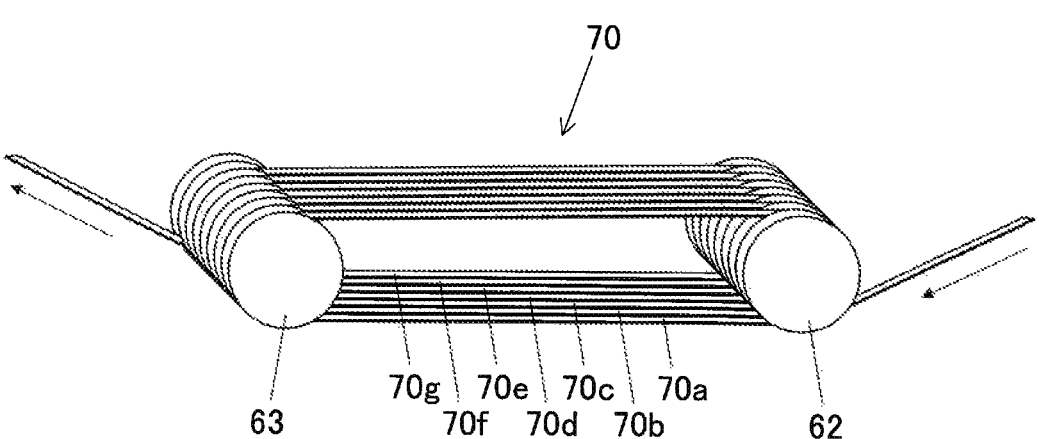
FIG. 4 is an enlarged illustration of the multipass tape deposition reel-to-reel system according to an example 1.

FIG. 4 is an enlarged illustration of the multipass tape deposition reel-to-reel system in the example 1 according to the present invention. As shown in FIG. 4, a winding number of the tape 70 by the guiding reels 62 and 63 was 7.

Firstly, it was found that stable plasma was obtained when power density of a magnetron was not more than 15 W/cm²

US 12,671,013 B2

9 | 10 and pressure of Ar gas is not less than 0.35 Pa and not more than 4.0 Pa. When the power density of a magnetron was more than 15 W/cm², arc discharge was generated. When the pressure of Ar gas was out of the range from 0.35 Pa to 4.0 Pa, the plasma was unstable and frequently faded out. Furthermore, when the pressure of Ar gas was not more than 0.5 Pa, higher deposition rate was obtained. Moreover, when the temperature in the reaction chamber was not less than 80 degrees C. and not more than 170 degrees C., high quality Al-containing films were obtained.

Figure 5:
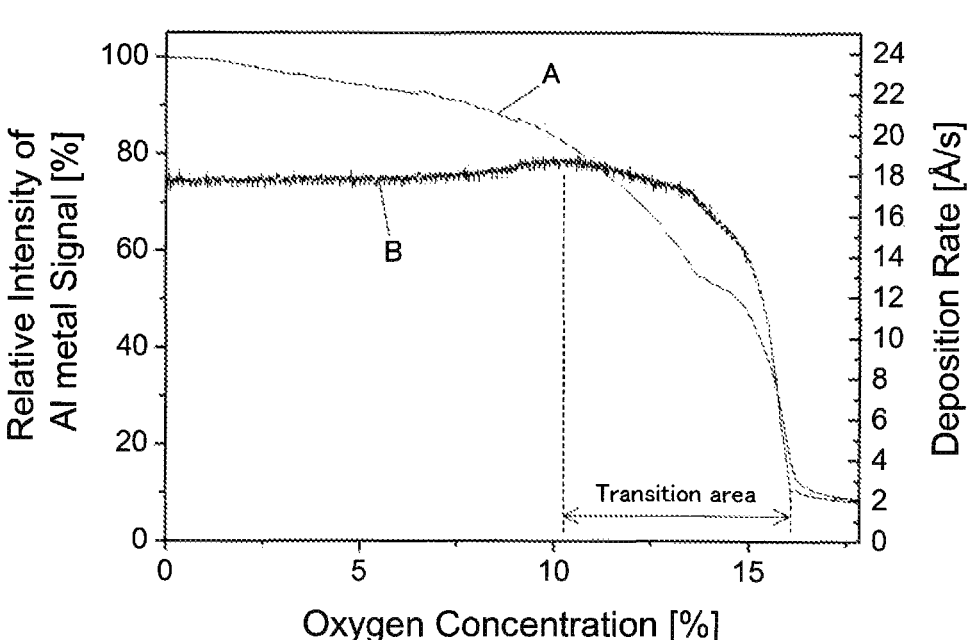
FIG. 5 shows a curve A and a curve B according to the example 1. The curve A shows relationship between a concentration of oxygen gas as reactant gas and an emission intensity of Al in plasma near the surface of the sputtering target. The curve B shows relationship between the concentration of the oxygen gas and a deposition rate of an Al-containing film containing both or either of $Al_2O_3$ and Al.

FIG. 5 shows a curve A and a curve B. The curve A shows relationship between a concentration of oxygen gas as reactant gas and an emission intensity of Al in plasma near the surface of the sputtering target 64. The curve B shows relationship between the concentration of the oxygen gas and a deposition rate of an Al-containing film containing both or either of $Al_2O_3$ and Al.

The horizontal axis of FIG. 5 shows the concentration of the oxygen gas in the reaction chamber. The left axis shows the emission intensity of Al in plasma in the range of 0-3 cm above the surface of the sputtering target 64, which was measured through the PMT unit 71, and the emission intensity is represented by a percentage of the first reference value, which is an emission intensity of Al at which the concentration of the oxygen gas is zero. The right axis shows the deposition rate of the Al-containing film (Å/s, angstrom/s), which was measured by a quartz crystal microbalance (QCM) sensor placed near the substrate surface.

The deposition rate of the Al-containing film in FIG. 5 was measured on the first wound part 70a of the tape 70 between the guiding reel 62 and the guiding reel 63.

The curve A shows that the emission intensity of Al decreases with increase of the concentration of the oxygen gas. This is because degree of oxidation of the surface of the sputtering target 64 increases with the increase of the concentration of the oxygen gas. Consequently, the Al-containing film is made of almost pure Al when the concentration of the oxygen gas is low (metal mode), and the Al-containing film is made of almost pure $Al_2O_3$ when the concentration of the oxygen gas is high (oxide mode). A transition area between the metal mode and the oxide mode is roughly shown in FIG. 5.

The curve B shows that the deposition rate of the Al-containing film quickly decreases around the oxide mode. This is because the surface of the sputtering target 64 became oxidized and Al oxide has higher crystal lattice energy than Al, which leads to lower sputtering rate.

Figure 6:
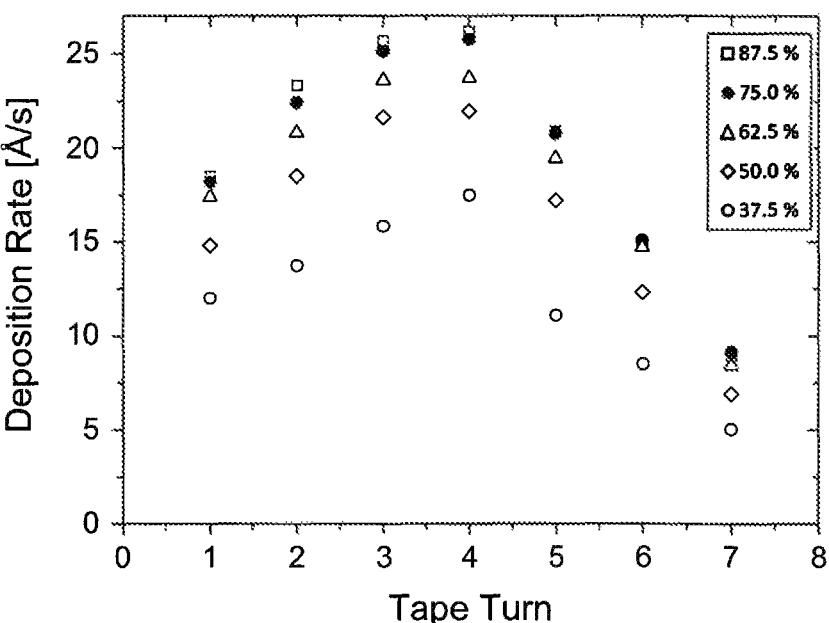
FIG. 6 shows deposition rates of the Al-containing film on each of the first wound parts to seventh wound parts of the tape when the emission intensity of Al is 37.5%, 50.0%, 62.5%, 75.0%, or 87.5% according to the example 1.

FIG. 6 shows deposition rates of the Al-containing film on each of the first wound parts 70a to seventh wound parts 70g of the tape 70 when the emission intensity of Al is 37.5%, 50.0%, 62.5%, 75.0%, or 87.5%.

Figure 7:
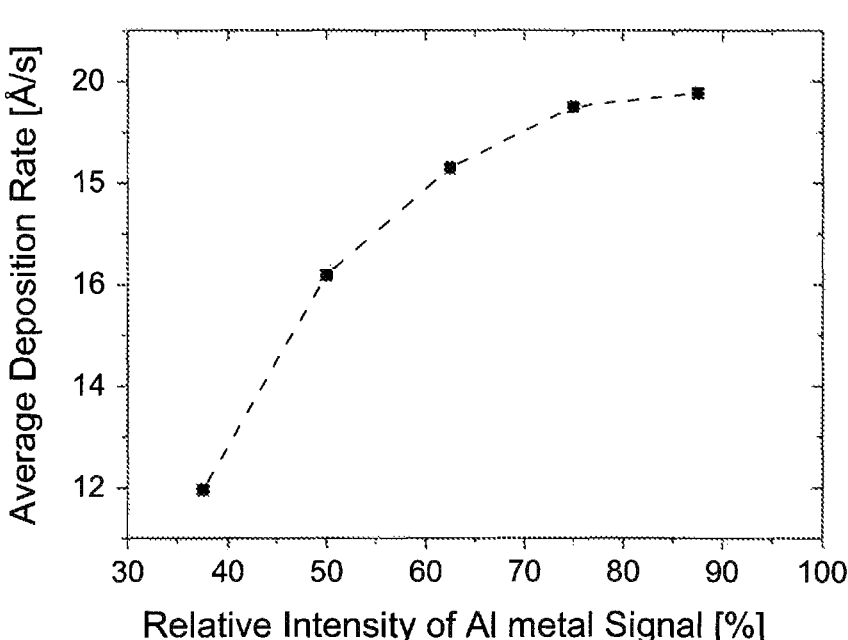
FIG. 7 shows relationship between an average of deposition rates of the Al-containing film on the first wound parts to seventh wound parts in the multipath deposition system and the emission intensity of Al according to the example 1.

FIG. 7 shows relationship between an average of deposition rates of the Al-containing film on the first wound parts 70a to seventh wound parts 70g in the multipath deposition system and the emission intensity of Al.

When the deposition rate of the Al-containing film is high, feeding rate of the tape 70 to form the Al-containing film having prescribed thickness can be high.

Table 1 shows feeding rates of the tape 70 for forming the Al-containing film having a thickness of 68 nm when the emission intensity of Al is 37.5%, 50.0%, 62.5%, 75.0%, or 87.5% and corresponding critical currents of superconducting wires as final products.

TABLE 1

| Al emission intensity (%) | Tape feeding rate (m/h) | Critical current (A) |
|---|---|---|
| 37.5 | 74 | 40 |
| 50.0 | 100 | 305 |
| 62.5 | 114 | 323 |
| 75.0 | 121 | 154 |
| 87.5 | 123 | 0 |
| Reference $Al_2O_3$ | 50 | 310 |

The superconducting wires were obtained through a process in which an $Y_2O_3$ film, a MgO film, a $LaMnO_3$ film, a $CeO_2$ film, a $GdBa_2Cu_3O_7$ film, and an Ag film were sequentially formed on the Al-containing film. The $Y_2O_3$ film and the $LaMnO_3$ film were formed by usual RF-magnetron sputtering. The MgO film was formed by the magnetron sputtering in which assisting Ar ion beam is applied. The $CeO_2$ film and the $GdBa_2Cu_3O_7$ film were formed by PLD method. The Ag film was formed by usual DC-magnetron sputtering.

Additionally, Table 1 shows a feeding rate of the tape 70 for forming the $Al_2O_3$ film having a thickness of 68 nm by usual RF-magnetron sputtering and a critical current of a superconducting wire having the $Al_2O_3$ film instead of the Al-containing film as a reference data.

The feeding rate of the tape 70 was higher than the reference data when the emission intensity of Al approximately was not less than 30% and not more than 80%, and a superconducting wire showed superconducting characteristic. Furthermore, the superconducting wire had the about the same critical current as the reference data when the emission intensity of Al approximately was not less than 50% and not more than 65%. Additionally, the composition of the Al-containing film was made of almost pure $Al_2O_3$ when the emission intensity of Al was not less than 30% and not more than 80%.

Consequently, the concentration of the oxygen gas for forming the $Al_2O_3$ layer 21 (the first concentration) is preferably a concentration at which the emission intensity of Al in plasma near the surface of the sputtering target is not less than 30% and not more than 80% of a first reference value, and is more preferably a concentration at which the emission intensity of Al in plasma near the surface of the sputtering target is not less than 50% and not more than 65% of a first reference value.

Example 2

Preferred forming conditions of the $Y_2O_3$ layer 22 by the reactive magnetron sputtering have been determined by experiments.

In an example 2, as in the example 1, plasma emission controller RU-1000 made by HORIBA STEC, Co., Ltd. was used as a plasma emission controller. Additionally, the tape 70 in the example 2 was composed of the electropolished Hastelloy tape having a width of 12 mm as the substrate 10 and an $Al_2O_3$ film formed on the Hastelloy tape by usual RF-magnetron sputtering. Moreover, a sputtering target made of yttrium metal was used as the sputtering target 64 for forming the $Y_2O_3$ layer 22.

As shown in FIG. 4, a winding number of the tape 70 by the winders 62 and 63 was 7.

Firstly, it was found that stable plasma was obtained when power density of a magnetron was not more than 13 W/cm² and pressure of Ar gas was not less than 0.25 Pa and not more than 1.5 Pa. When the power density of a magnetron was more than 13 W/cm², arc discharge was generated. When the pressure of Ar gas was out of the range from 0.25 Pa to 1.5 Pa, the plasma was unstable and frequently faded out. Furthermore, when the pressure of Ar gas was not less than 0.75 Pa and not more than 0.85 Pa, higher deposition rate was obtained. The $Y_2O_3$ layer 22 was formed at room temperature in order to avoid crystallization of the $Y_2O_3$ layer 22.

Figure 8:
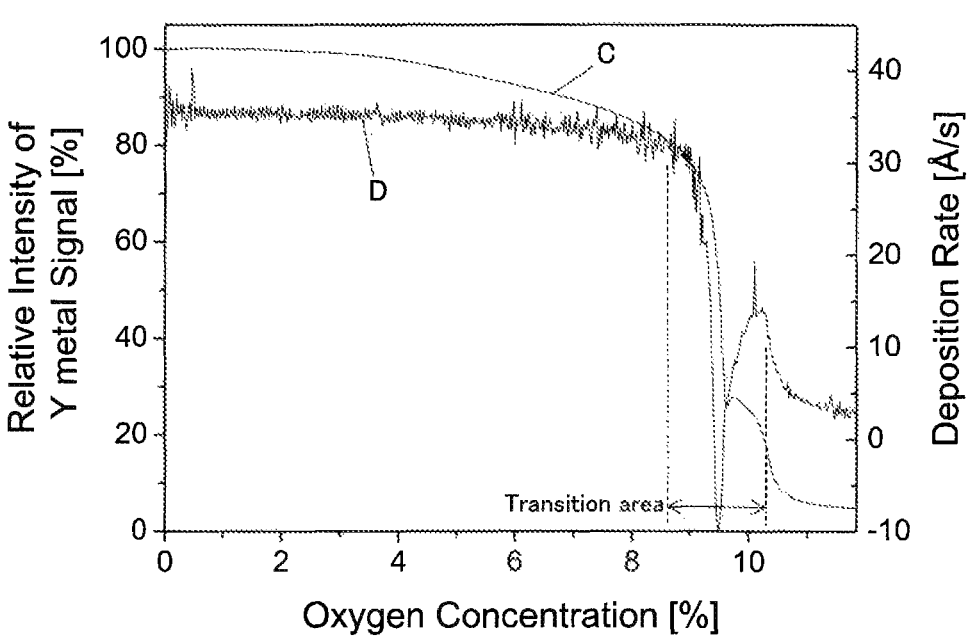
FIG. 8 shows a curve C and a curve D according to an example 2. The curve C shows relationship between a concentration of oxygen gas as reactant gas and an emission intensity of Y in plasma near the surface of the sputtering target. The curve D shows relationship between the concentration of the oxygen gas and a deposition rate of an Y-containing film containing both or either of $Y_2O_3$ and Y.

FIG. 8 shows a curve C and a curve D. The curve C shows relationship between a concentration of oxygen gas as reactant gas and an emission intensity of Y in plasma near the surface of the sputtering target 64. The curve D shows relationship between the concentration of the oxygen gas and a deposition rate of a Y-containing film containing both or either of $Y_2O_3$ and Y.

The horizontal axis of FIG. 8 shows the concentration of the oxygen gas in the reaction chamber. The left axis shows the emission intensity of Y in plasma in the range of 0-3 cm above the surface of the sputtering target 64, which was measured through the PMT unit 71, and the emission intensity is represented by a percentage of the second reference value, which is an emission intensity of Y at which the concentration of the oxygen gas is zero. The right axis shows the deposition rate of the Y-containing film (A/s, angstrom/s), which was measured by the QCM sensor.

The deposition rate of the Y-containing film in FIG. 8 was measured on the first wound part 70a of the tape 70 between winder 62 and winder 63.

The curve C shows that the emission intensity of Y decreases with increase of the concentration of the oxygen gas. This is because degree of oxidation of the surface of the sputtering target 64 increases with the increase of the concentration of the oxygen gas. Consequently, the Y-containing film is made of almost pure Y when the concentration of the oxygen gas is low (metal mode), and the Y-containing film is made of almost pure $Y_2O_3$ when the concentration of the oxygen gas is high (oxide mode). A transition area between the metal mode and the oxide mode is roughly shown in FIG. 8.

Furthermore, when the emission intensity of Y was not more than 35%, operation speed of the plasma emission controller was not enough for stable control of deposition condition of the Y-containing film because the oxidation of the surface of the sputtering target 64 rapidly proceeded. Additionally, the curve D shows that the deposition rate of the Y-containing film rapidly decreased when the emission intensity of Y was not more than 30%. This may be because the deposition rate was out of a measurable range of the QCM sensor.

Figure 9:
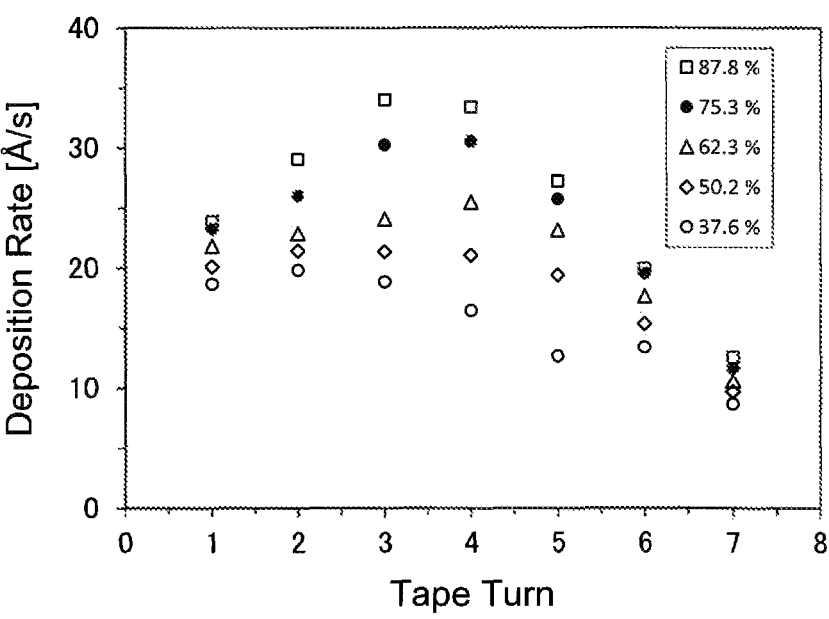
FIG. 9 shows deposition rates of the Y-containing film on each of the first wound parts to seventh wound parts of the tape when the emission intensity of Y is 37.6%, 50.2%, 62.3%, 75.3%, or 87.8% according to the example 2.

FIG. 9 shows deposition rates of the Y-containing film on each of the first wound parts 70a to seventh wound parts 70g of the tape 70 when the emission intensity of Y is 37.6%, 50.2%, 62.3%, 75.3%, or 87.8%.

Figure 10:
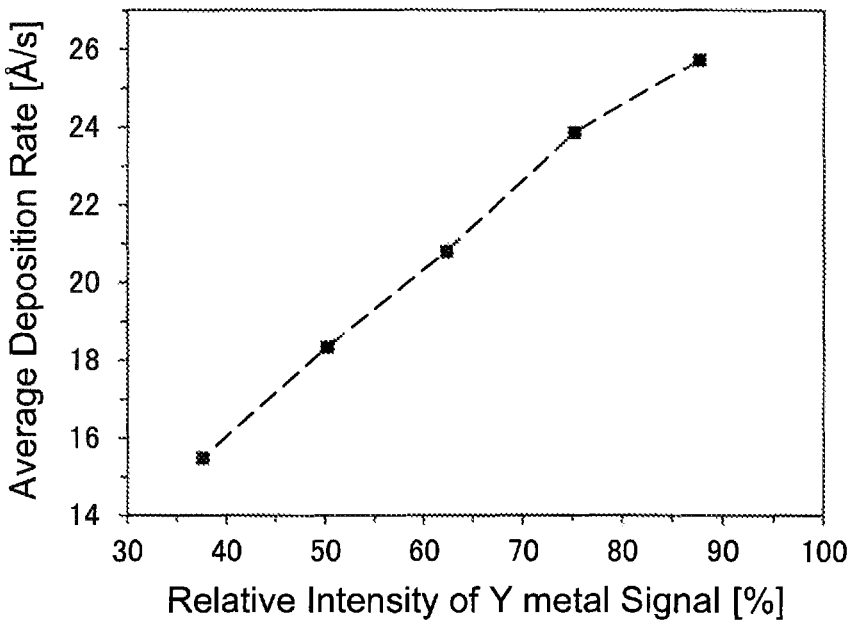
FIG. 10 shows relationship between an average of deposition rates of the Y-containing film on the first wound parts to seventh wound parts and the emission intensity of Y according to the example 2.

FIG. 10 shows relationship between an average of deposition rates of the Y-containing film on the first wound parts 70a to seventh wound parts 70g and the emission intensity of Y.

When the deposition rate of the Y-containing film is high, feeding rate of the tape 70 to form the Y-containing film having prescribed thickness can be high.

Table 2 shows feeding rates of the tape 70 for forming the Y-containing film having a thickness of 45 nm when the emission intensity of Y is 37.6%, 50.2%, 62.3%, 75.3%, or 87.8% and critical currents of superconducting wires as final products.

TABLE 2

| Y emission intensity (%) | Tape feeding rate (m/h) | Critical current (A) |
|---|---|---|
| 37.6 | 150 | 335 |
| 50.2 | 200 | 307 |
| 62.3 | 225 | 351 |
| 75.3 | 260 | 323 |
| 87.8 | 280 | 295-310 |
| Reference $Y_2O_3$ | 80 | 319 |

The superconducting wires were obtained through a process in which a MgO film, a $LaMnO_3$ film, a $CeO_2$ film, a $GdBa_2Cu_3O_7$ film, and an Ag film were sequentially formed on the Y-containing film. The $LaMnO_3$ film was formed by usual RF-magnetron sputtering. The MgO film was formed by the RF-magnetron sputtering in which assisting Ar ion beam is applied. The $CeO_2$ film and the $GdBa_2Cu_3O_7$ film were formed by PLD method. The Ag film was formed by usual DC-magnetron sputtering.

Additionally, Table 2 shows a feeding rate of the tape 70 for forming the $Y_2O_3$ film having a thickness of 45 nm by usual RF-magnetron sputtering and a critical current of a superconducting wire having the $Y_2O_3$ film instead of the Y-containing film as a reference data.

The feeding rate of the tape 70 was higher than the reference data when the emission intensity of Y approximately was not less than 30% and not more than 90%, and the superconducting wire had about the same critical current as the reference data. On the other hand, according to FIG. 8, 80% is the onset of the rapid decrease of the emission intensity of Y, which means that metal rapidly oxidizes in the plasma and a good quality $Y_2O_3$ is obtained. Furthermore, when the emission intensity of Y approximately was not less than 30% and not more than 65%, dispersion of the critical current could be suppressed. Additionally the composition of the Y-containing film was made of almost pure $Y_2O_3$ when the emission intensity of Y was not less than 30% and not more than 90%.

Consequently, the concentration of the oxygen gas for forming the $Y_2O_3$ layer 22 (the second concentration) is preferably a concentration at which the emission intensity of Y in plasma near the surface of the sputtering target is not less than 30% and not more than 80% of a second reference value, and is more preferably a concentration at which the emission intensity of Y in plasma near the surface of the sputtering target is not less than 30% and not more than 65% of a first reference value.

Example 3

Preferred forming conditions of the MgO layer 23 by the reactive magnetron sputtering have been determined by experiments.

In an example 3, as in the example 1, plasma emission controller RU-1000 made by HORIBA STEC, Co., Ltd. was used as a plasma emission controller. Additionally, the tape 70 in the example 3 was composed of an electropolished Hastelloy tape having a width of 12 mm as the substrate 10, an $Al_2O_3$ film formed on the Hastelloy tape by usual RF-magnetron sputtering, and an $Y_2O_3$ film formed on the $Al_2O_3$ film by usual RF-magnetron sputtering. Moreover, a sputtering target made of magnesium metal was used as the sputtering target 64 for forming the MgO layer 23.

As shown in FIG. 4, a winding number of the tape 70 by the winders 62 and 63 was 7.

Firstly, it was found that stable plasma was obtained when power density of a magnetron was not more than 12.5 W/cm$^2$ and pressure of Ar gas was not less than 0.13 Pa and not more than 0.30 Pa. When the power density of a magnetron was more than 12.5 W/cm$^2$, arc discharge was generated. When the pressure of Ar gas was out of the range from 0.13 Pa to 0.30 Pa, the plasma was unstable and frequently faded out. Furthermore, it was required for application of IBAD that the pressure of Ar gas was not higher than 0.30 Pa. The MgO layer 23 was formed at room temperature because heating negatively affected the texture of the MgO layer 23.

Figure 11:
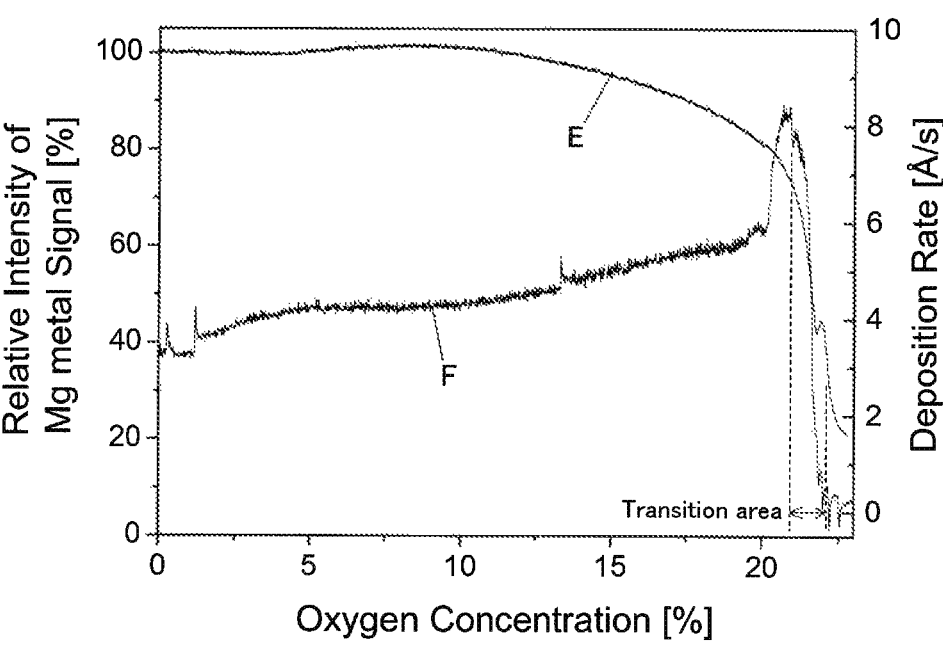
FIG. 11 shows a curve E and a curve F according to an example 3. The curve E shows relationship between a concentration of oxygen gas as reactant gas and an emission intensity of Mg in plasma near the surface of the sputtering target. The curve F shows relationship between the concentration of the oxygen gas and a deposition rate of a Mg-containing film containing both or either of MgO and Mg.

FIG. 11 shows a curve E and a curve F. The curve E shows relationship between a concentration of oxygen gas as reactant gas and an emission intensity of Mg in plasma near the surface of the sputtering target 64. The curve F shows relationship between the concentration of the oxygen gas and a deposition rate of a Mg-containing film containing both or either of MgO and Mg.

The horizontal axis of FIG. 11 shows the concentration of the oxygen gas in the reaction chamber. The left axis shows the emission intensity of Mg in plasma in the range of 0-3 cm above the surface of the sputtering target 64, which was measured through the PMT unit 71, and the emission intensity is represented by a percentage of the third reference value, which is an emission intensity of Mg at which the concentration of the oxygen gas is zero. The right axis shows the deposition rate of the Mg-containing film (Å/s, angstrom/s), which was measured by the QCM sensor.

The deposition rate of the Mg-containing film in FIG. 11 was measured on the first wound part 70a of the tape 70 between winder 62 and winder 63.

The curve E shows that the emission intensity of Mg decreases with increase of the concentration of the oxygen gas. This is because degree of oxidation of the surface of the sputtering target 64 increases with the increase of the concentration of the oxygen gas. Consequently, the Mg-containing film contains large amount of Mg metal when the concentration of the oxygen gas is low (metal mode), and the Mg-containing film is made of almost pure MgO when the concentration of the oxygen gas is high (oxide mode). A transition area between the metal mode and the oxide mode is roughly shown in FIG. 11.

Additionally, the curve E shows that a transition area in formation of the Mg-containing film was very narrow. Furthermore, the curve E has an abnormality at a point in the transition area at which the emission intensity of Mg is approximately 45% of the third reference value. This shows that a feedback algorithm of the plasma emission controller cannot control an oxygen partial pressure in the vicinity of the abnormal point.

Consequently, the concentration of the oxygen gas for forming the MgO layer 23 (the third concentration) is required to be a concentration at which the emission intensity of Mg in plasma near the surface of the sputtering target is less than 45% of the third reference value. Note that, the Mg-containing film was made of almost pure MgO at which the emission intensity of Mg is less than 45% of the third reference value.

Next, the superconducting wire as a final product was obtained through a process in which a LaMnO$_3$ film, a CeO$_2$ film, a GdBa$_2$Cu$_3$O$_7$ film, and an Ag film were sequentially formed on the Mg-containing film. The LaMnO$_3$ film was formed by usual RF-magnetron sputtering. The CeO$_2$ film and the GdBa$_2$Cu$_3$O$_7$ film were formed by PLD method. The Ag film was formed by usual DC-magnetron sputtering.

Figure 12:
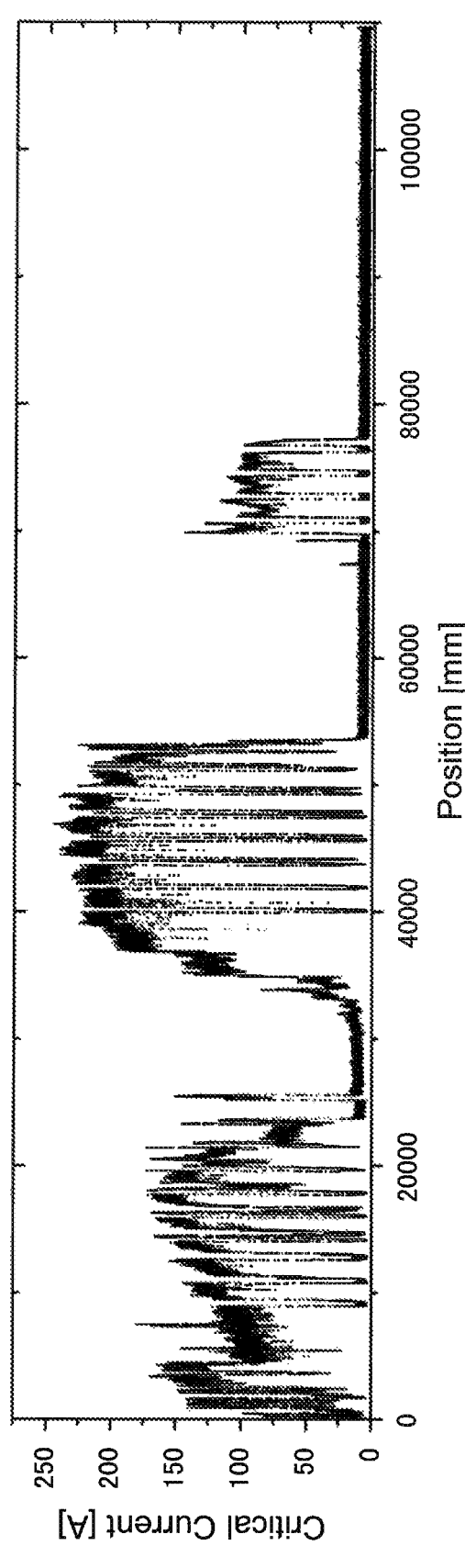
FIG. 12 is measured data of a critical current Ic vs Length of a superconducting wire as a final product according to the example 3.

FIG. 12 is a measurement data of a critical current Ic vs Length of the superconducting wire as a final product. A Mg-containing film of the superconducting wire in FIG. 12 has regions that are formed under different IBAD conditions in order to measure relationship between an IBAD condition and a critical current. The position between approximately 0 mm and approximately 25000 mm, the position between approximately 38000 mm and approximately 54000 mm, and the position between approximately 70000 mm and approximately 77000 mm correspond to the three regions formed under different IBAD conditions. The IBAD condition includes ion acceleration energy and ion current. The horizontal axis of FIG. 12 shows a position along the length of the superconducting wire. The vertical axis shows the critical current of the superconducting wire.

In the measurement data in FIG. 12, a critical current exceeds 200 A in a part on which the position along the length of the superconducting wire is between approximately 38000 mm and approximately 54000 mm. A Mg-containing film corresponding to the part was formed under an IBAD condition in which an energy of assisting Ar ion beam is 1000 eV, an ion current is 200 mA and the third concentration was an oxygen gas concentration at which the emission intensity of Mg was 31% of a third reference value.

Additionally a Mg-containing film corresponding to a part on which the position along the length of the superconducting wire is between approximately 0 mm and approximately 25000 mm was formed under an IBAD condition in which an energy of assisting Ar ion beam is 1000 eV, an ion current is 180 mA and the third concentration was an oxygen gas concentration at which the emission intensity of Mg was 26% of a third reference value. Moreover, a Mg-containing film corresponding to a part on which the position along the length of the superconducting wire is between approximately 70000 mm and approximately 77000 mm was formed under an IBAD condition in which an energy of assisting Ar ion beam is 1000 eV, an ion current is 180 mA and the third concentration was an oxygen gas concentration at which the emission intensity of Mg was 35% of a third reference value.

Example 4

A critical current of a first specimen that was the superconducting wire 1 in which the buffer layer 20 contained the MgO layer 23 formed by the reactive magnetron sputtering was compared with a critical current of a second specimen that was the superconducting wire 1 in which the buffer layer 20 contained a MgO layer formed by usual magnetron sputtering instead of the MgO layer 23.

The first specimen contained the substrate 10 made of an electropolished Hastelloy tape, the buffer layer 20, the CeO$_2$ layer 30, the superconducting layer 40 made of GdBa$_2$Cu$_3$O$_7$, and the protecting layer 50 made of Ag. The buffer layer 20 was composed of the Al$_2$O$_3$ layer 21, the Y$_2$O$_3$ layer 22, the MgO layer 23 and LaMnO$_3$ layer 24.

The Al$_2$O$_3$ layer 21 and the Y$_2$O$_3$ layer 22 of the first specimen were formed by the reactive magnetron sputtering in the above embodiment. The MgO layer 23 of the first specimen was formed by the reactive magnetron sputtering in which assisting Ar ion beam is applied in the above embodiment. Then LaMnO$_3$ layer 24 was deposited by RF magnetron sputtering. The CeO$_2$ layer 30 and the superconducting layer 40 of the first specimen were formed by PLD method. The protecting layer 50 of the first specimen was formed by usual DC-magnetron sputtering.

The second specimen contained a MgO layer formed by magnetron sputtering in which a sputtering target made of MgO was used and assisting Ar ion beam was applied instead of the MgO layer 23 of the first specimen.

Figure 13:
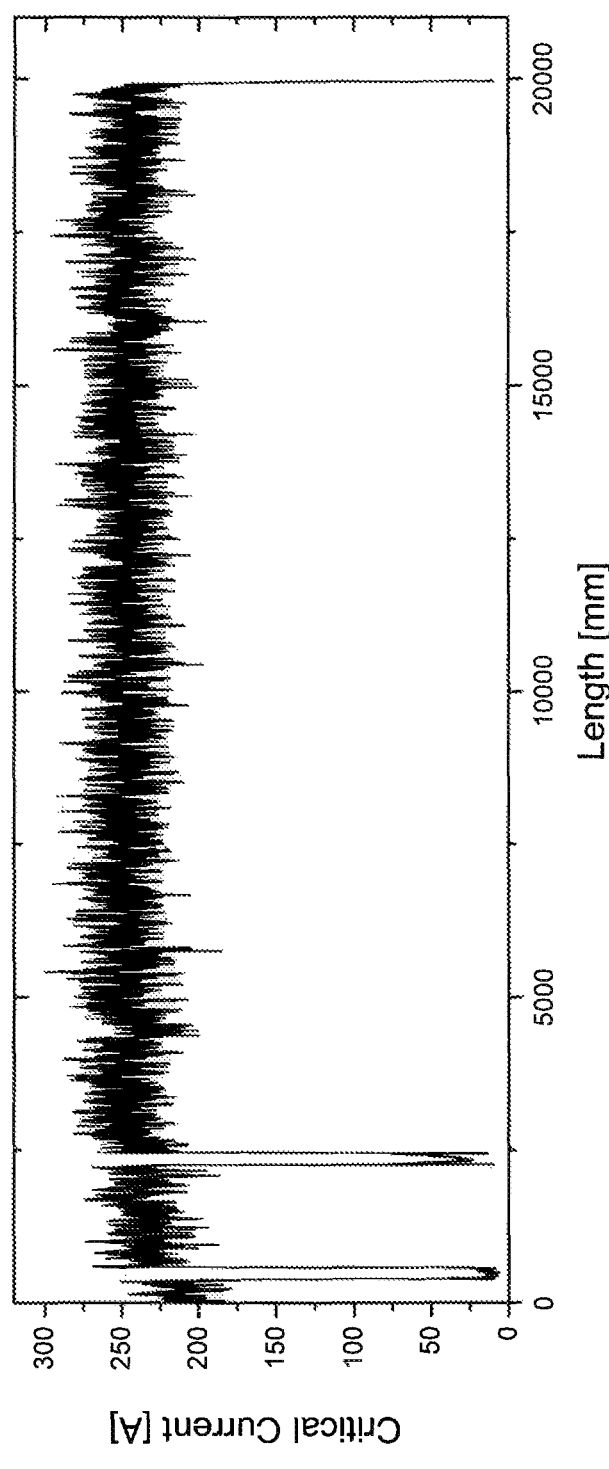
FIG. 13 is a graph that shows a critical current Ic vs Length of the first specimen according to the example 4.

FIG. 13 is a graph that shows a critical current Ic vs Length of the first specimen. FIG. 13 shows that the critical current of the first specimen is approximately 250 A.

Figure 14:
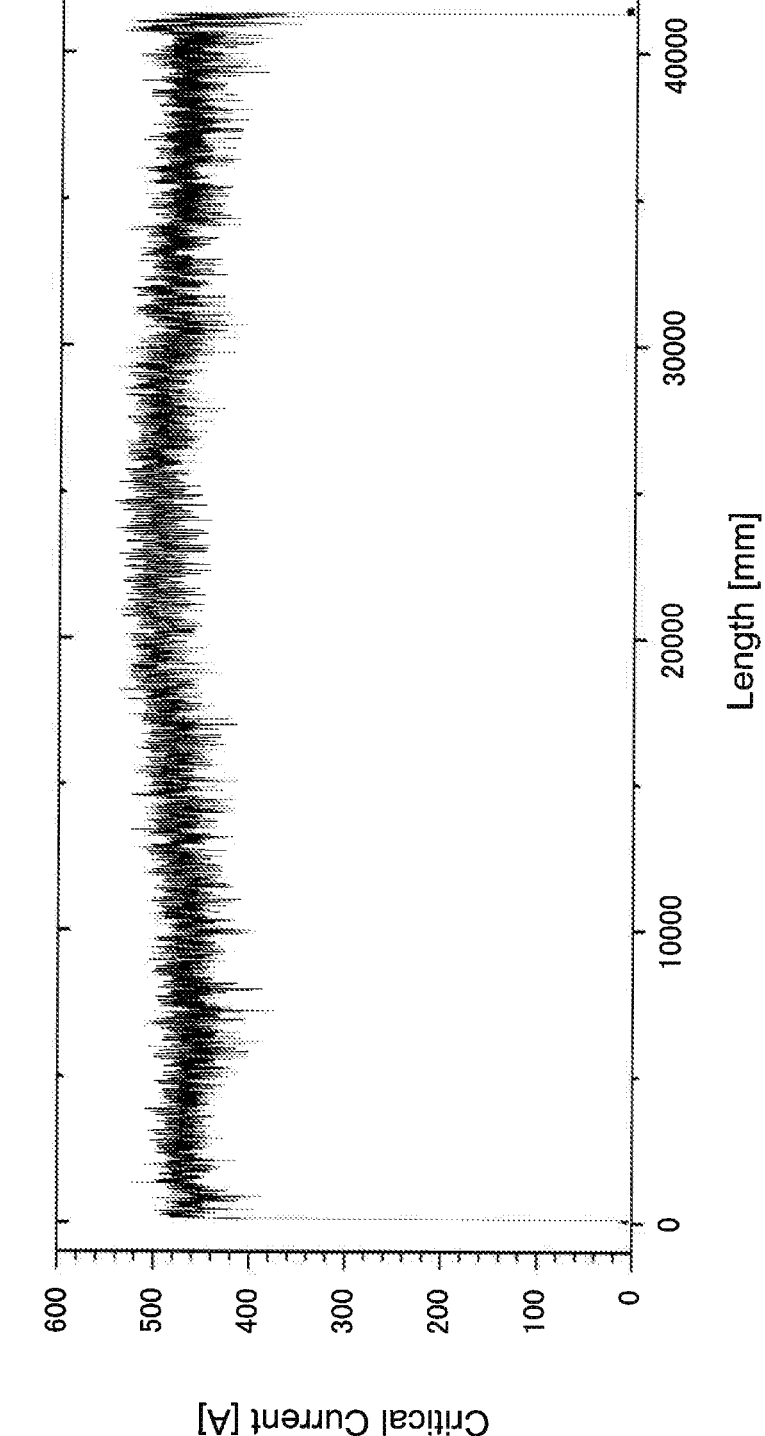
FIG. 14 is a graph that shows a critical current Ic vs Length of the second specimen according to the example 4.

FIG. 14 is a graph that shows a critical current Ic vs Length of the second specimen. FIG. 14 shows that the critical current of the second specimen is approximately 500 A.

In comparison between FIG. 13 and FIG. 14, the second specimen has higher critical current than the first specimen. On the other hand, a production cost of the first specimen was lower than a production cost of the second specimen because the MgO layer 23 was formed in a short time by the reactive magnetron sputtering. Consequently, the first specimen and the second specimen can be used for different purposes. Note that, both the production cost of the first specimen and the production cost of the second specimen are lower than a production cost of a conventional superconducting wire in which a buffer layer formed by usual magnetron sputtering because faster process, such as the reactive magnetron sputtering, is used for formation of buffer layers of the first specimen and the second specimen.

In the present invention, various modifications are possible within the scope that is not limited to the embodiments and examples described above, without departing from the spirit or change techniques of the present invention.

Although the present invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

According to the invention, it is possible to provide a method of fabricating a superconducting wire that can fabricate a superconducting wire at a high production rate and a low cost.

REFERENCE SINGS LIST 1 superconducting wire
10 substrate
20 buffer layer
21 Al$_2$O$_3$ layer
22 Y$_2$O$_3$ layer
23 MgO layer
40 superconducting layer

The invention claimed is:

1. A method of fabricating a superconducting wire, comprising:

forming a buffer layer on the substrate, the buffer layer comprising an Al$_2$O$_3$ layer, the Al$_2$O$_3$ layer being formed by reactive magnetron sputtering in which first oxygen gas as reactant gas and a sputtering target made of aluminium metal are used, the Al$_2$O$_3$ layer being formed while being supplied the first oxygen gas at a first concentration, the first concentration being a concentration of the first oxygen gas at which an emission intensity of Al in plasma near a surface of the sputtering target is not less than 25% and not more than 80% of a first reference value, the first reference value being the emission intensity of Al at which a concentration of the first oxygen gas is zero; and forming a superconducting layer above the buffer layer.

2. The method of fabricating a superconducting wire according to claim 1, wherein the first concentration is a concentration of the first oxygen gas at which an emission intensity of Al is not less than 30% and not more than 80% of the first reference value.

3. The method of fabricating a superconducting wire according to claim 1, wherein the buffer layer comprises an Y$_2$O$_3$ layer on the Al$_2$O$_3$ layer, the Y$_2$O$_3$ layer being formed by reactive magnetron sputtering in which second oxygen gas as reactant gas and a sputtering target made of yttrium metal are used, the Y$_2$O$_3$ layer being formed while being supplied the second oxygen gas at a second concentration, the second concentration being a concentration of the second oxygen gas at which an emission intensity of Y in plasma near a surface of the sputtering target is not less than 15% and not more than 90% of a second reference value, the second reference value being the emission intensity of Y at which a concentration of the second oxygen gas is zero.

4. The method of fabricating a superconducting wire according to claim 3, wherein the second concentration is the concentration of the second oxygen gas at which an emission intensity of Y is not less than 30% and not more than 80% of the second reference value.

5. The method of fabricating a superconducting wire according to claim 3, wherein the buffer layer comprises an MgO layer having a biaxially textured structure on the Y$_2$O$_3$ layer, the MgO layer being formed by reactive magnetron sputtering in which third oxygen gas as reactant gas and a sputtering target made of magnesium metal are used and assisting Ar ion beam is applied, the MgO layer being formed while being supplied the third oxygen gas at a third concentration, the third concentration being a concentration of the third oxygen gas at which an emission intensity of Mg in plasma near a surface of the sputtering target made of magnesium metal is less than 50% of a third reference value, the third reference value being an emission intensity of Mg at which a concentration of the third oxygen gas is zero.

6. The method of fabricating a superconducting wire according to claim 3, wherein the buffer layer comprises an MgO layer having a biaxially textured structure on the Y$_2$O$_3$ layer, the MgO layer being formed by magnetron sputtering in which a sputtering target made of MgO is used and assisting Ar ion beam is applied.

7. The method of fabricating a superconducting wire according to claim 1, wherein a process environment utilizes Ar and O$_2$ as a reactive gas.

8. The method of fabricating a superconducting wire according to claim 7, wherein the reactive magnetron sputtering comprises RF magnetron sputtering.

9. The method of fabricating a superconducting wire according to claim 1, further comprising controlling reactions in a transition area of reactive magnetron sputtering.

10. The method of fabricating a superconducting wire according to claim 1, wherein the first concentration being the concentration of the first oxygen gas at which the emission intensity of Al in plasma near the surface of the sputtering target is controlled to be not less than 25% and not more than 80% of the first reference value.

11. A method of fabricating a superconducting wire, comprising:

forming a buffer layer on the substrate, the buffer layer comprising an $Y_2O_3$ layer, the $Y_2O_3$ layer being formed by reactive magnetron sputtering in which second oxygen gas as reactant gas and a sputtering target made of yttrium metal are used, the $Y_2O_3$ layer being formed while being supplied the second oxygen gas at a second concentration, the second concentration being a concentration of the second oxygen gas at which an emission intensity of Y in plasma near a surface of the sputtering target is measured to be not less than 15% and not more than 90% of a first reference value, the first reference value being the emission intensity of Y at which a concentration of the first oxygen gas is zero; and forming a superconducting layer above the buffer layer.

12. The method of fabricating a superconducting wire according to claim 11, wherein the first concentration is a concentration of the first oxygen gas at which an emission intensity of Y is not less than 30% and not more than 80% of the second reference value.

13. The method of fabricating a superconducting wire according to claim 11, wherein the buffer layer comprises an MgO layer having a biaxially textured structure on the $Y_2O_3$ layer, the MgO layer being formed by reactive magnetron sputtering in which second oxygen gas as reactant gas and a sputtering target made of magnesium metal are used and assisting Ar ion beam is applied, the MgO layer being formed while being supplied the third oxygen gas at a second concentration, the second concentration being a concentration of the second oxygen gas at which an emission intensity of Mg in plasma near a surface of the sputtering target made of magnesium metal is less than 50% of a second reference value, the second reference value being the emission intensity of Mg at which the concentration of the second oxygen gas is zero.

14. The method of fabricating a superconducting wire according to claim 11, wherein the buffer layer comprises an MgO layer having a biaxially textured structure on the $Y_2O_3$ layer, the MgO layer being formed by magnetron sputtering in which a sputtering target made of MgO is used and assisting Ar ion beam is applied.

15. The method of fabricating a superconducting wire according to claim 11, wherein a process environment utilizes Ar and $O_2$ as a reactive gas.

16. The method of fabricating a superconducting wire according to claim 15, wherein the reactive magnetron sputtering comprises RF magnetron sputtering.

17. The method of fabricating a superconducting wire according to claim 11, further comprising controlling reactions in a transition area of reactive magnetron sputtering.

18. A method of fabricating a superconducting wire, comprising:

forming a buffer layer on the substrate, the buffer layer comprising an MgO layer, the MgO layer being formed by reactive magnetron sputtering in which third oxygen gas as reactant gas and a sputtering target made of magnesium metal are used and to which ion beam assisted deposition is applied, the MgO layer being formed while being supplied the first oxygen gas at a first concentration, the first concentration being a concentration of the first oxygen gas at which an emission intensity of Mg in plasma near a surface of the sputtering target is measured to be less than 50% of a first reference value, the first reference value being an emission intensity of Mg at which the concentration of the first oxygen gas is zero; and forming a superconducting layer above the buffer layer.

19. The method of fabricating a superconducting wire according to claim 18, wherein a process environment utilizes Ar and $O_2$ as a reactive gas, and wherein the reactive magnetron sputtering comprises RF magnetron sputtering.

20. The method of fabricating a superconducting wire according to claim 18, further comprising controlling reactions in a transition area of reactive magnetron sputtering.

\* \* \* \* \*